(12) United States Patent
Behl et al.

(10) Patent No.: US 11,467,742 B2
(45) Date of Patent: Oct. 11, 2022

(54) CONFIGURABLE MEMORY ARCHITECTURE FOR COMPUTER PROCESSING SYSTEMS

(71) Applicant: NXP USA, Inc., Austin, TX (US)

(72) Inventors: Ankur Behl, New Delhi (IN); Rakesh Pandey, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/167,198

(22) Filed: Feb. 4, 2021

(65) Prior Publication Data
US 2022/0197523 A1 Jun. 23, 2022

(30) Foreign Application Priority Data
Dec. 17, 2020 (IN) .............................. 202021055076

(51) Int. Cl.
*G06F 3/06* (2006.01)
*G06F 9/4401* (2018.01)
*G06F 13/16* (2006.01)
*G06F 13/40* (2006.01)

(52) U.S. Cl.
CPC .......... *G06F 3/0631* (2013.01); *G06F 3/0604* (2013.01); *G06F 3/0673* (2013.01); *G06F 9/4401* (2013.01); *G06F 13/1668* (2013.01); *G06F 13/4027* (2013.01)

(58) Field of Classification Search
CPC .... G06F 3/0631; G06F 3/0604; G06F 3/0673; G06F 9/4401; G06F 13/1668; G06F 13/4027
See application file for complete search history.

(56) References Cited

U.S. PATENT DOCUMENTS

| 8,533,403 | B1* | 9/2013 | Law | G06F 13/1605 |
| | | | | 711/158 |
| 8,819,309 | B1 | 8/2014 | Bruce et al. | |
| 9,292,380 | B2 | 3/2016 | Singh et al. | |
| 9,928,884 | B1 | 3/2018 | Gou et al. | |
| 11,036,403 | B2* | 6/2021 | Zamsky | G11C 7/1075 |
| 2008/0046665 | A1* | 2/2008 | Kim | G06F 9/544 |
| | | | | 711/149 |
| 2011/0078367 | A1 | 3/2011 | Minkin et al. | |
| 2015/0261709 | A1 | 9/2015 | Billi | |

* cited by examiner

*Primary Examiner* — Idriss N Alrobaye
*Assistant Examiner* — Richard B Franklin

(57) ABSTRACT

An integrated circuit (IC) includes a memory manager having a plurality of memory ports, each configured to communicate with a corresponding floating memory block. The IC includes a first interconnect for a first domain, wherein the first interconnect has a first set of fixed ports configured to communicate with memory blocks dedicated to the first domain and a first set of floating ports configured to communicate with the memory manager, and a second interconnect for a second domain, wherein the second interconnect has a second set of fixed ports configured to communicate with memory blocks dedicated to the second domain and a second set of floating ports configured to communicate with the memory manager. The memory manager is configured to allocate a first portion of the memory ports to the first set of floating ports and a second portion of the memory ports to the second set of floating ports.

20 Claims, 2 Drawing Sheets

CONFIGURABLE MEMORY ARCHITECTURE FOR COMPUTER PROCESSING SYSTEMS

BACKGROUND

Field

This disclosure relates generally to integrated circuit devices, and more specifically, to a dynamic memory architecture for computer processing systems.

Related Art

With the increase in complexity and data processing needs of embedded and non-embedded processing systems, there is a significant reliance on system memory, leading to an ever-increasing size of system memory. This is particularly true in small embedded processing devices, such as systems on a chip (SOC) that include one or more processing cores and memory devices together in a single packaged device.

Each SOC is expected to support a varying variety of applications that need to operate through the system memory. A common example is where both real time operating system and application software are executing from system memory. Real time domains controlling actuators for devices such as automobiles and other equipment have real time requirements for quick response. In other areas, applications processing, such as sensor data processing, places large demands on system bandwidth, requiring greater processing speed and throughput than real-time processing.

In addition, safety requirements for the real-time and application domains can be quite different. Each user may distribute safety, control and data processing workload differently, with different memory requirements associated with each domain. The different requirements necessitate splitting system memory between the real time domain the application domain. In some cases, users require additional memory in both domains, depending on the implementation, but quite often a configuration that meets the needs of one implementation either does not have sufficient resources to meet the processing needs of another implementation, or surplus components are included in a fixed configuration that are not required. For example, additional random access memory (RAM) that cannot be used by two domains may remain unutilized. When low latency bus masters of the real time domain access the RAM of the application domain, operations may be throttle by the high latency of a pipelined interconnect, in which case real-time capability is not possible.

Similarly when high bandwidth bus masters need to access RAM that is shared with the real time bus masters, the performance of the high bandwidth bus masters may decrease significantly, and may even impact accesses by the real-time bus masters.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of integrated circuits for implementing computer processing systems, such as systems on a chip (SOCs), disclosed herein include a floating memory architecture with blocks of memory that can be allocated in various configurations to different bus masters (also referred to as domains) based on processing and memory storage requirements. Other memory blocks are also included that are dedicated to specific bus masters. The configurations may be specified by the user during system startup or restart. The processing systems can be configured for various uses such as low latency real time systems and for high bandwidth application processing. The floating memory blocks can be allocated among the different bus masters or domains as needed. A memory manager for the floating memory blocks can receive traffic from multiple domains, such as low latency real time operating bus masters as well as from high bandwidth application bus masters, and accesses the floating memory blocks according the configuration currently set for the particular mix of domains. Additionally, a step size for the blocks can be configured for the different domains. The memory manager maintains data coherency of the floating memory blocks, and is placed between interconnect circuits and the floating memory blocks, thus eliminating the need for any hardware or software changes in the SOC or the bus masters. The memory manager can also support dynamic arbitration (if required) and generate response errors, if enabled.

Figure 1:
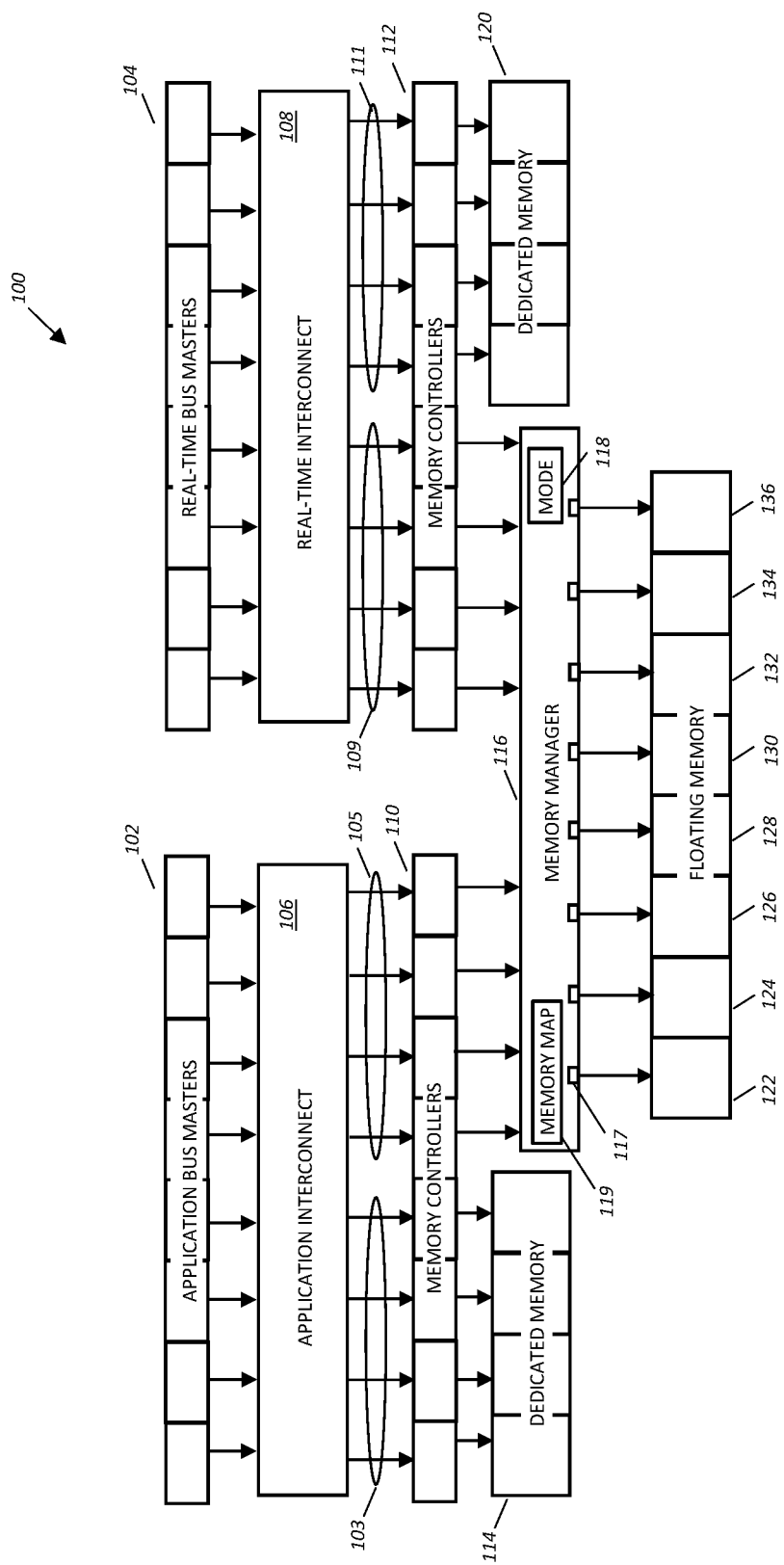
FIG. 1 illustrates a block diagram of components of a processing system in accordance with selected embodiments of the present invention.

The term "bus master" refers to a set of logic instructions in a microprocessor or an input/output controller, such as controllers for direct memory access, peripherals, math accelerators, graphics cards, hard drives, solid state drives, Wi-Fi, and Ethernet hardware connections FIG. 1 illustrates a block diagram of components of a processing system 100 in accordance with selected embodiments of the present invention including a set of application bus masters 102 and a set of real time bus masters 104, application interconnect 106, real-time interconnect 108, memory controllers 110, 112, dedicated memory blocks 114, 120, memory manager 116 with memory map 119 and mode indicator 118, and floating memory blocks 122-136. Application bus masters 102 typically require high processing or communication bandwidth, while real-time bus masters 104 typically require low latency where it is desirable to avoid placing requests/responses in queues to wait for resources, such as memory. Considering vehicles with automated features such as adaptive cruise control as an example, application bus masters 102 can handle functions such as network communication for infotainment and sensor fusion, while real time bus masters 104 handle functions for engine and braking control and sensor management, and in particular as higher levels of autonomous driving are provided. One domain can also have a different automotive safety integrity level (ASIL) than the other domain. ISO 26262, titled "Road vehicles—Functional safety", is an international standard for functional safety of electrical and/or electronic systems in serial production road vehicles, defined by the International Organization for Standardization (ISO) that specifies the necessary safety requirements for achieving an acceptable risk level. For example, engine and braking control functions in real time bus masters 104 may be required to meet ASIL-D requirements whereas infotainment functions in application bus masters 102 may only need to meet ASIL-B requirements.

Application bus masters 102 and real-time bus masters 104 are referred to as domains and are used as an example of how processing system 100 can be configured to meet different, even sometimes competing, processing requirements. Processing system 100 can include other domains in addition to or instead of application bus masters 102 and real-time bus masters 104, and the other domains may have different characteristics or processing requirements than application bus masters 104 and real-time bus masters 104.

Application bus masters 102 are coupled to communicate with memory controllers 110 through application interconnect 106. A first set of fixed or dedicated memory ports 103 provides a communication path between application interconnect 106 and dedicated memory blocks 114. A second set of configurable or floating memory ports 105 provides part of a communication path between application interconnect 106 and memory manager 116. Memory manager 116 includes memory ports 117, with each of one or more of memory ports 117 providing a communication path between one of a subset of memory controllers 110 and one of floating memory blocks 122-136. In the example shown, processing system 100 is configured with eight application bus masters 102 and eight memory controllers 110. Four of memory controllers 110 are coupled to four corresponding dedicated memory blocks 114 and the remaining four of memory controllers 110 are coupled to memory manager 116.

Real-time bus masters 104 are coupled to communicate with memory controllers 110 through real-time interconnect 108. A first set of fixed or dedicated memory ports 111 provides part of a communication path between real-time interconnect 108 and dedicated memory blocks 120. A second set of configurable or floating memory ports 109 provides a communication path between real-time interconnect 108 and memory manager 116. Memory manager 116 includes memory ports 117, with each one of memory ports 117 providing a communication path between one of a subset of memory controllers 112 and one of floating memory blocks 122-136. In the example shown, processing system 100 is configured with eight real time bus masters 104 and eight memory controllers 112. Four of memory controllers 112 are coupled to four corresponding dedicated memory blocks 120 and the remaining four of memory controllers 112 are coupled to memory manager 116.

The number of floating memory blocks 122-136 allocated to each domain is variable and can be configured during power up or reset. In other cases, the allocation of floating memory blocks 122-136 may be statically allocated for a particular configuration that is not expected to change. Memory manager 116 is coupled to each of floating memory blocks 122-136, however any number of floating memory blocks 122-136 may be allocated for use solely by application bus masters 102 with the remaining floating memory blocks 122-136 may be allocated for use solely by real time bus masters 104.

Memory manager 116 also includes memory map 119 and mode indicator 118. Mode indicator 118 can be used to store a value that indicates which of floating memory blocks 122-136 are allocated to which domain. For example, one value of mode indicator can indicate that floating memory blocks 122-126 are allocated for use by application bus masters 102 and memory blocks 130-136 are allocated for use by real time bus masters 104. In addition, some or all of floating memory blocks 122-136 allocated to a domain may not be used. Memory manager 116 functions as a memory mux that receives messages from multiple domains and floating memory blocks 122-136 and uses memory map 119 to determine where to route messages to and from floating memory blocks 122-136. Note that if floating memory blocks 122-136 are not required in processing system 100, memory manager 116 and floating memory blocks 122-136 can be bypassed.

Each of floating memory blocks 122-136 will have a same size or storage capacity, but the bus width for floating memory blocks 122-136 allocated to one domain may be different than the bus width for floating memory blocks 122-136 allocated to another domain. For example, the bus width for application bus masters 102 can be 128 bits while the bus width for real time domain can be 64 bits, or vice versa, depending on throughput needs. In addition, different "step size", which refers to the minimum granularity at which memory selection can be altered across domains, such as application bus masters 102 and real-time bus masters 104, can be variable. For example, given a total amount of floating memory space of 1 Megabyte, with a step size of 256 kilobytes, options for partitioning memory blocks 122-136 between application bus masters 102 and real-time bus masters 104 can be as follows:

| Floating memory allocated to application bus masters | Floating memory allocated to real time bus masters |
|---|---|
| 1 MB | 0 MB |
| 768 KB | 256 KB |
| 512 KB | 512 KB |
| 256 KB | 768 KB |
| 0 MB | 1 MB |

Note that other step sizes can be used, however.

Dedicated memory blocks 114 are always coupled for use by application bus masters 102 and cannot be accessed by real-time bus masters 104. Similarly, dedicated memory blocks 120 are always coupled for use by real-time bus masters and cannot be accessed by application bus masters 102. Floating memory blocks 122-136 can be allocated to application bus masters 102 and real-time bus masters 104 in a variety of different configurations, depending on processing and memory access requirements. For example, a greater number of floating memory blocks 122-136 can be allocated to one domain than the other.

Dedicated memory blocks 114, 120 and floating memory blocks 122-136 may include one or more volatile storage (or memory) devices such as random access memory (RAM), static RAM (SRAM), or other types of volatile storage devices. In addition, or in the alternative, memory blocks 114, 120, 122-136 may be implemented using magnet RAM, resistive RAM, or the like. In whatever form, memory blocks 114, 120, 122-136 may store information including sequences of instructions that are executed by one of bus masters 102, 104. For example, executable code and/or data, in including but not limited to an operating system, device drivers, firmware (e.g., input output basic system or BIOS), and/or applications can be loaded in memory blocks 114, 120, 122-136 and executed by bus masters 102, 104.

Bus masters 102, 104 can include computer processor circuitry capable of performing functions that may be implemented as software instructions, hardware circuitry, firmware, or a combination of software, hardware and firmware. Operations and functions may be performed under the control of an operating system. One or more instances of software application code may be executed at the same time.

Bus masters 102, 104 may access at least some of the data and instructions required to provide the desired functionality from dedicated memory blocks 114, 120 via respective interconnects 106, 108 and memory controllers 110, 112. Bus masters 102, 104 may access additional data and instructions in floating memory blocks 122-136 via respective interconnects 106, 108, memory controllers 110, 112, and memory manager 116.

Interconnects 106, 108 are configured to handle specific protocols and instructions sets for different bus masters 102, 104. For example, in automobiles that include driver assistance features, application interconnect 106 can be configured to use protocols suitable for domains such as infotainment and body electronics while real-time interconnect 108 can be configured to use protocols for domains such as driver assistance, safety, and vehicle motion. The protocols can include Ethernet, controller area network (CAN), local interconnect network (LIN), Flexray, Mobile Industry Processor Interface (MIPI), secure hardware extensions (SHE), direct memory access (DMA), among others.

Bus masters 102, 104 may include a complex instruction set computing (CISC) microprocessor, reduced instruction set computing (RISC) microprocessor, very long instruction word (VLIW) microprocessor, DMA controllers, or processor implementing other instruction sets, or processors implementing a combination of instruction sets. In addition or in the alternative, bus masters 102, 104 may be one or more special-purpose processors such as an application specific integrated circuit (ASIC), direct memory access controller, sensor controller, a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions. One or more levels of cache memory may be included in processor bus masters. In addition to routing requests and responses between bus masters 102, 104 and memory controllers 110, 112, interconnects 106, 108 can route requests and responses between other components (not shown) of processing system 100 such as a power mode controller, peripheral interfaces, and I/O devices. Bus masters 102, 104 and their corresponding interconnects 106, 108, memory controllers 110, 112 and dedicated memory blocks 114, 120 may each be implemented as systems on a chip (SoC). Memory manager 116 and floating memory blocks 122-136 may be included in processing system external to the SoCs. In other implementations, the components of processing system 100 may be implemented in separate chips, or with two or more, or all, of the components in the same device.

Processing system 100 can also include one or more network ports (not shown) configurable to connect to one or more networks, which may likewise be accessible to one or more remote nodes. The remote nodes can include other applications processors, devices or sensors that can exchange information with processing system 100. Processing system can further include one or more peripherals interfaces (not shown) that are communicatively coupled to interconnects 106, 108. Peripheral interfaces can include, for example, circuitry to perform power management, flash management, interconnect management, USB, and other PHY type tasks. A variety of peripheral devices (not shown) such as sensors, field programmable gate arrays, external integrated circuits, a mouse, keyboard, printer, display monitor, external memory drives, cameras, and lights, among others, can be coupled to processing system 100 via the peripheral interfaces.

Figure 2:
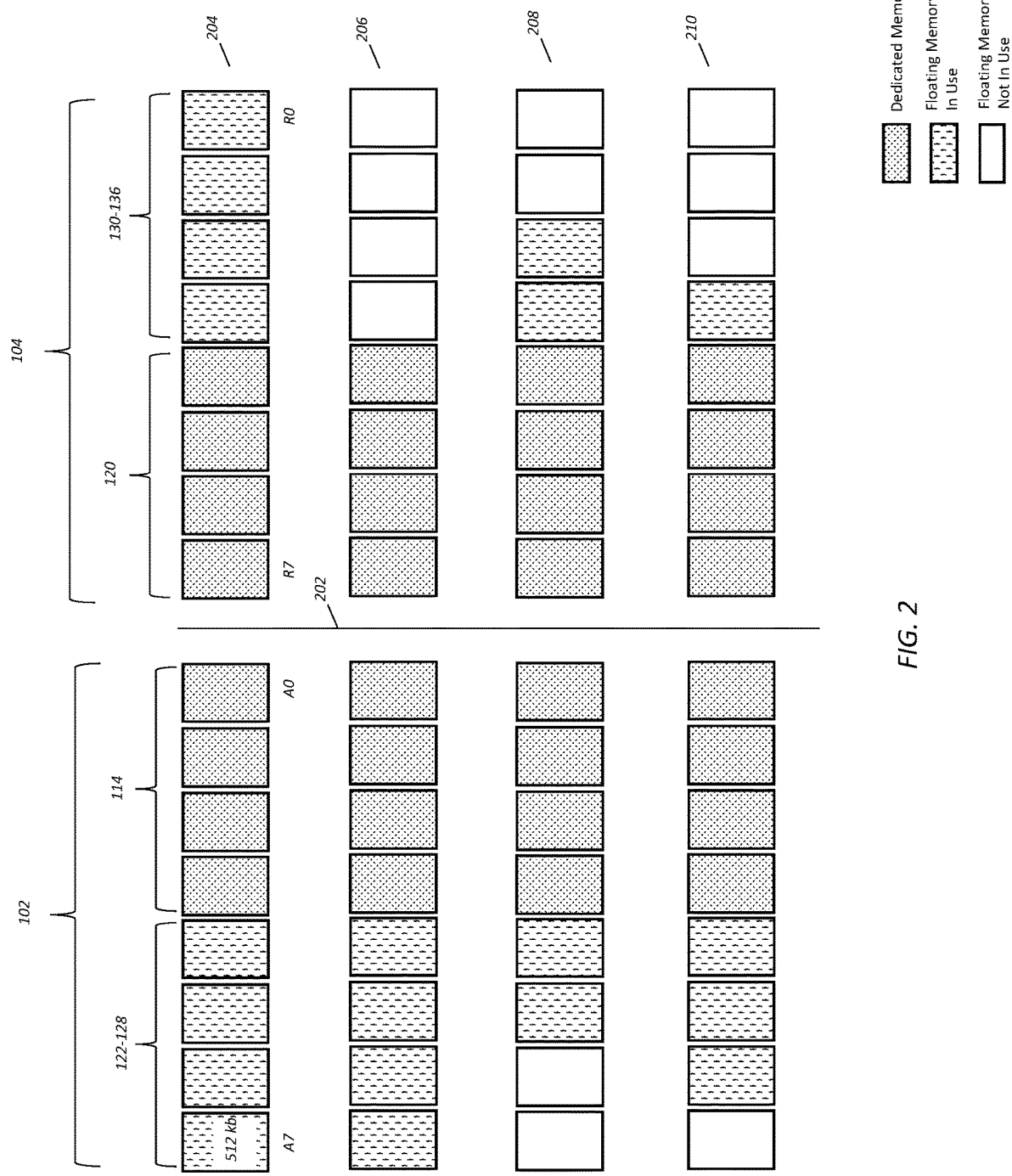
FIG. 2 illustrates examples of different possible memory configurations for the processing system of FIG. 1.

Referring to FIGS. 1 and 2, FIG. 2 illustrates examples of different possible memory configurations for the processing system 100 of FIG. 1. Each memory block 122-128, 114, 120, 130-136 is the same size, for example, 512 kilobytes, and there are thus four megabytes allocated to each domain, and a total sixteen memory blocks between the two domains of application bus masters 102 and real time bus masters 104. Memory map 119 is implemented as a center-spread address map that enables flexible allocation to a domain while avoiding hardware and software complexity. Sixteen memory blocks 122-128, 114, 120, 130-136 provide eight megabytes of overall memory space. Center point 202 is midpoint between memory blocks 122-128, 114 and 120, 130-136, with a total of four megabytes of memory composed of eight 512 kilobyte blocks in each domain. Eight memory blocks 122-128 and 114 allocated to application bus masters 102 ascends from address A0 to address A7, with A0 being at center point 202. Eight memory blocks 120 and 130-136 allocated to real time bus masters 104 descend from address R7 at center point 202 to address R0. As shown for memory configuration 204, application bus masters 102 and real time bus masters 104 are each using two megabytes of dedicated memory blocks 114, 120 and two megabytes of floating memory blocks 122-128, 130-136.

Memory configuration 206 in FIG. 2 shows application bus masters 102 using two megabytes of floating memory blocks 122-128 and 2 megabytes of dedicated memory blocks 114 while real time bus masters 104 are using 2 megabytes of dedicated memory blocks 120 while 2 megabytes of floating memory blocks 130-136 are not used.

Memory configuration 208 shows application bus masters 102 using one megabyte of floating memory blocks 122-128 and 2 megabytes of dedicated memory blocks 114. Real time bus masters 104 are also using 2 megabytes of dedicated memory blocks 120 and one megabyte of floating memory blocks 130-132. One megabyte of floating memory blocks 134-136 is not used.

Memory configuration 210 shows application bus masters 102 using one and half megabytes of floating memory blocks 122-128 and 2 megabytes of dedicated memory blocks 114 while real time bus masters 104 are using 2 megabytes of dedicated memory blocks 120 and half a megabyte of floating memory blocks 130-136.

Note that other configurations as well as size and number of dedicated memory blocks 114, 120 and floating memory blocks 122-136 can be used in processing system 100, depending on the number and types of bus masters 102, 104 being used.

By now it should be appreciated that the use of memory manager 116 and floating memory blocks 122-136 enable processing system 100 to be designed with optimal memory sizes, without any restriction on performance. Floating memory blocks 122-136 can support both high bandwidth as well as low latency domains and enable scalable, realizable and cost-effective solutions for simultaneous execution of multiple asymmetric operating systems. Memory manager 116 and floating memory blocks 122-136 do not require any software or hardware changes to memory controllers 110, 112 and do not add any additional software requirements or restrictions for addressing floating memory blocks 122-136. In addition, floating memory blocks 122-136 being allocated to different domains minimizes cross-domain accesses, enabling higher system performance. Further, the architecture and use of floating memory blocks 122-136 allows processing system 100 to maintain the required ASIL integrity, irrespective of the configuration of floating memory blocks 122-136 and irrespective of the ASIL domain of the rest of processing system 100.

In some embodiments, there has been provided an integrated circuit that can comprise a memory manager (116) having a plurality of memory ports (117), each memory port configured to communicate with a corresponding floating memory block of a plurality of floating memory blocks (122-136). A first interconnect for a first domain (106) includes a first set of fixed ports (103) configured to communicate with one or more memory blocks dedicated to the first domain (114) and a first set of floating ports (105) configured to communicate with the memory manager. A second interconnect for a second domain (108) includes a second set of fixed ports (111) configured to communicate with one or more memory blocks dedicated to the second domain (120) and a second set of floating ports (109) configured to communicate with the memory manager. The memory manager is configured to allocate, based upon a mode indicator, a first portion (selected portion of 122-136) of the plurality of memory ports to the first set of floating ports for the first domain and a second, non-overlapping, portion of the plurality of memory ports (other selected portion of 122-136) to the second set of floating ports for the second domain.

In other aspects, a value of the mode indicator indicates which memory ports (and thus floating memory blocks) are allocated as the first portion of the plurality of memory ports and which memory ports are allocated as the second portion of the plurality of memory ports.

In other aspects, the memory manager is configured to perform the allocation at at least one of run time under supervision of trusted software or boot time.

In other aspects, the first domain is a bandwidth critical domain and the second domain is a latency critical domain.

In other aspects, each fixed port of the first set of fixed ports is configured to communicate with a memory block of the one or more memory blocks dedicated to the first domain via a corresponding memory controller (part of 110), and each floating port of the first set of floating ports is configured to communicate with the memory manager via a corresponding memory controller (part of 110).

In other aspects, each fixed port of the second set of fixed ports is configured to communicate with a memory block of the one or more memory blocks dedicated to the second domain via a corresponding memory controller (part of 112), and each floating port of the second set of floating ports is configured to communicate with the memory manager via a corresponding memory controller (part of 112).

In other aspects, a memory map with a total size equivalent to a summation of sizes of the one or more memory blocks dedicated to the first domain (size of 114) and the plurality of floating memory blocks (size of 122-128) is reserved for the first domain, and a memory map with a total size equivalent to a summation of sizes of the one or more memory blocks dedicated to the second domain (size of 120) and the plurality of floating memory blocks (size of 122-128) is reserved for the second domain.

In other aspects, the memory map reserved for the first domain begins at a first start address and ascends to a first end address, and the memory map reserved for the second domain begins at second start address and descends to a second end address.

In other aspects, the first start address and the second start address are contiguous addresses.

In other aspects, the first interconnect implements enqueueing of transactions and the second interconnect does not implement enqueuing of transactions.

In other aspects, the first domain has a different safety integrity level than the second domain.

In other aspects, the mode indicator is programmable, and the memory manager is configured to perform the allocation, based on the mode indicator, at reset.

In other embodiments, an integrated circuit can comprise a first interconnect for a first domain (106) which is bandwidth critical, includes a first set of fixed ports (103) configured to communicate with one or more memory blocks dedicated to the first domain (114) via corresponding first domain memory controllers (left part of 110) and a first set of floating ports (105) configured to communicate with a first set of floating memory blocks (selected portion of 122-136) of a plurality of floating memory blocks (122-136) via corresponding first domain memory controllers (right part of 110). A second interconnect for a second domain (108) which is latency critical, includes a second set of fixed ports (111) configured to communicate with one or more memory blocks dedicated to the second domain (120) via corresponding second domain memory controllers (right part of 112) and a second set of floating ports (109) configured to communicate with a second set of floating memory blocks (selected portion of 122-136) of the plurality of floating memory blocks (122-136) via corresponding second domain memory controllers (right part of 112). A memory manager (116) is configured to allocate, based on a mode indicator (118), a first portion of the plurality of floating memory blocks to the first domain as the first set of floating memory blocks and a second portion of the plurality of floating memory blocks to the second domain as the second set of floating memory blocks, wherein the first portion and second portion are mutually exclusive.

In other aspects, the memory manager can be configured to route communication between the first portion of the plurality of floating memory blocks and the corresponding first domain memory controllers and between the second portion of the plurality of floating memory blocks and the corresponding first domain memory controllers.

In further aspects, each of the first domain memory controllers corresponding to the first set of floating ports (controllers of right part of 110) communicate with the memory manager with a first bandwidth (e.g. 128*b*) and each of the second domain controllers corresponding to the second set of floating ports (controllers of the left part of 112) communicate with the memory manager with a second bandwidth (e.g. 64*b*) which is smaller than the first bandwidth.

In further aspects, the memory manager can communicate with each floating block of the plurality of floating blocks using a same bandwidth (e.g. 64 bits).

In further aspects, each of the first domain memory controllers corresponding to the first set of fixed ports communicate with the one or more memory blocks is dedicated to the first domain using the first bandwidth, and each of the second domain controllers corresponding to the second set of fixed ports communicate with the one or more memory blocks dedicated to the second domain using the second bandwidth.

In further aspects, after allocation by the memory manager, masters (102) of the first domain are configured to access floating memory blocks in the first portion of the plurality of floating memory blocks via the corresponding first domain controllers and the memory manager, and masters (104) of the second domain are configured to access floating memory blocks in the second portion of the plurality of floating memory blocks via corresponding second domain controllers and the memory manager.

In further aspects, after allocation by the memory manager, the masters of the first domain are unable to access floating memory blocks corresponding to the second portion of the plurality of memory blocks and the masters of the second domain are unable to access floating memory blocks corresponding to the first portion of the plurality of memory blocks. If an error in the software generates such accesses, error responses can be generated for such transactions.

In further aspects, a value the mode indicator indicates how many floating memory blocks are allocated in the first portion and how many floating memory blocks are allocated in the second portion.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
a memory manager having a plurality of memory ports, each memory port configured to communicate with a corresponding floating memory block of a plurality of floating memory blocks;
a first interconnect for a first domain, the first interconnect having a first set of fixed ports configured to communicate with one or more memory blocks dedicated to the first domain and a first set of floating ports configured to communicate with the memory manager;
a second interconnect for a second domain, the second interconnect having a second set of fixed ports configured to communicate with one or more memory blocks dedicated to the second domain and a second set of floating ports configured to communicate with the memory manager,
wherein the memory manager is configured to allocate, based upon a mode indicator, a first portion of the plurality of memory ports to the first set of floating ports for the first domain and a second, non-overlapping, portion of the plurality of memory ports to the second set of floating ports for the second domain.

2. The integrated circuit of claim 1, wherein a value of the mode indicator indicates which memory ports are allocated as the first portion of the plurality of memory ports and which memory ports are allocated as the second, non-overlapping, portion of the plurality of memory ports.

3. The integrated circuit of claim 1, wherein the memory manager is configured to perform the allocation at least one of run time under supervision of trusted software or boot time.

4. The integrated circuit of claim 1, wherein the first domain is a bandwidth critical domain and the second domain is a latency critical domain.

5. The integrated circuit of claim 1, wherein each fixed port of the first set of fixed ports is configured to communicate with a memory block of the one or more memory blocks dedicated to the first domain via a corresponding memory controller, and each floating port of the first set of floating ports is configured to communicate with the memory manager via a corresponding memory controller.

6. The integrated circuit of claim 5, wherein each fixed port of the second set of fixed ports is configured to communicate with a memory block of the one or more memory blocks dedicated to the second domain via a corresponding memory controller, and each floating port of the second set of floating ports is configured to communicate with the memory manager via a corresponding memory controller.

7. The integrated circuit of claim 1, wherein a memory map with a total size equivalent to a summation of sizes of the one or more memory blocks dedicated to the first domain and the plurality of floating memory blocks is reserved for the first domain, and a memory map with a total size equivalent to a summation of sizes of the one or more memory blocks dedicated to the second domain and the plurality of floating memory blocks is reserved for the second domain.

8. The integrated circuit of claim 7, wherein the memory map reserved for the first domain begins at a first start address and ascends to a first end address, and the memory map reserved for the second domain begins at second start address and descends to a second end address.

9. The integrated circuit of claim 8, wherein the first start address and the second start address are contiguous addresses.

10. The integrated circuit of claim 1, wherein the first interconnect implements enqueueing of transactions and the second interconnect does not implement enqueuing of transactions.

11. The integrated circuit of claim 1, wherein the first domain has a different safety integrity level than the second domain.

12. The integrated circuit of claim 1, wherein the mode indicator is programmable, and the memory manager is configured to perform the allocation, based on the mode indicator, during boot up sequence.

13. An integrated circuit, comprising:
- a first interconnect for a first domain which is bandwidth critical, the first interconnect having a first set of fixed ports configured to communicate with one or more memory blocks dedicated to the first domain via corresponding first domain memory controllers and a first set of floating ports configured to communicate with a first set of floating memory blocks of a plurality of floating memory blocks via corresponding first domain memory controllers;
- a second interconnect for a second domain which is latency critical, the second interconnect having a second set of fixed ports configured to communicate with one or more memory blocks dedicated to the second domain via corresponding second domain memory controllers and a second set of floating ports configured to communicate with a second set of floating memory blocks of the plurality of floating memory blocks via corresponding second domain memory controllers; and
- a memory manager configured to allocate, based on a mode indicator, a first portion of the plurality of floating memory blocks to the first domain as the first set of floating memory blocks and a second portion of the plurality of floating memory blocks to the second domain as the second set of floating memory blocks, wherein the first portion and second portion are mutually exclusive.

14. The integrated circuit of claim 13, wherein the memory manager is configured to route communication between the first portion of the plurality of floating memory blocks and the corresponding first domain memory controllers and between the second portion of the plurality of floating memory blocks and the corresponding first domain memory controllers.

15. The integrated circuit of claim 13, wherein each of the first domain memory controllers corresponding to the first set of floating ports communicate with the memory manager with a first bandwidth and each of the second domain controllers corresponding to the second set of floating ports communicate with the memory manager with a second bandwidth which is smaller than the first bandwidth.

16. The integrated circuit of claim 15, wherein the memory manager communicates with each floating block of the plurality of floating memory blocks using a same bandwidth.

17. The integrated circuit of claim 15, wherein each of the first domain memory controllers corresponding to the first set of fixed ports communicate with the one or more memory blocks dedicated to the first domain using the first bandwidth, and each of the second domain controllers corresponding to the second set of fixed ports communicate with the one or more memory blocks dedicated to the second domain using the second bandwidth.

18. The integrated circuit of claim 13, wherein, after allocation by the memory manager, masters of the first domain are configured to access floating memory blocks in the first portion of the plurality of floating memory blocks via the corresponding first domain controllers and the memory manager, and masters of the second domain are configured to access floating memory blocks in the second portion of the plurality of floating memory blocks via corresponding second domain controllers and the memory manager.

19. The integrated circuit of claim 18, wherein, after allocation by the memory manager, the masters of the first domain are unable to access floating memory blocks corresponding to the second portion of the plurality of floating memory blocks and the masters of the second domain are unable to access floating memory blocks corresponding to the first portion of the plurality of floating memory blocks.

20. The integrated circuit of claim 13, wherein a value the mode indicator indicates how many floating memory blocks are allocated in the first portion and how many floating memory blocks are allocated in the second portion.

* * * * *